United States Patent
Kim et al.

(10) Patent No.: US 7,388,533 B2
(45) Date of Patent: Jun. 17, 2008

(54) MULTI-BIT SIGMA-DELTA MODULATOR AND DIGITAL-TO-ANALOG CONVERTER WITH ONE DIGITAL-TO-ANALOG CAPACITOR

(75) Inventors: Yi Gyeong Kim, Daejeon (KR); Chong Ki Kwon, Daejeon (KR); Jong Dae Kim, Daejeon (KR); Min Hyung Cho, Daejeon (KR); Seung Chul Lee, Daejeon (KR); Gyu Hyun Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/588,455

(22) Filed: Oct. 27, 2006

(65) Prior Publication Data

US 2007/0126615 A1    Jun. 7, 2007

(30) Foreign Application Priority Data

Dec. 6, 2005   (KR) .................. 10-2005-0118141
Jun. 5, 2006   (KR) .................. 10-2006-0050320

(51) Int. Cl.
*H03M 1/82* (2006.01)
*H03M 3/00* (2006.01)

(52) U.S. Cl. ..................... 341/150; 341/143
(58) Field of Classification Search ............... 341/143, 341/150
See application file for complete search history.

(56) References Cited

U.S. PATENT DOCUMENTS 5,191,332 A * 3/1993 Shieu .................. 341/143
5,274,375 A * 12/1993 Thompson ............ 341/143
5,406,283 A    4/1995 Leung
6,081,218 A * 6/2000 Ju et al. .............. 341/150
6,429,798 B1   8/2002 Dent
6,573,850 B1   6/2003 Pennock
6,937,176 B2   8/2005 Freeman et al.
7,102,558 B2 * 9/2006 Deval ................... 341/150

FOREIGN PATENT DOCUMENTS

| JP | 11-055121      | 2/1999  |
| JP | 2002-368616    | 12/2002 |
| JP | 2003-023356    | 1/2003  |
| JP | 2003023356     | 1/2003  |
| KR | 1020060009527  | 2/2006  |
| WO | WO 95/34134    | 12/1995 |

OTHER PUBLICATIONS

Baird, Rex T. and Terri S. Fiez, "Improved ΔΣ DAC Linearity Using Data Weighted Averaging," 1995 IEEE.
Yu, Jiang and Franco Maloberti, "A Low-Power Multi-Bit ΔΣ Modulator in 90nm Digital CMOS Without DEM," 2005 IEEE International Solid-State Circuits Conference.

* cited by examiner

*Primary Examiner*—Howard Williams
(74) *Attorney, Agent, or Firm*—Ladas & Parry LLP

(57) ABSTRACT

A digital-to-analog converter (DAC) for a sigma-delta modulator is provided. The DAC has a switched capacitor structure using an operational amplifier (OP amp) and performs a function exceeding 3-level using a switching method employing only one capacitor in single ended form. Thus, DAC non-linearity caused by capacitor mismatching does not occur, and the number of output levels of the DAC is increased. Also, the DAC capacitor may be applied to a general DAC to increase the ratio of DAC output levels to capacitors.

5 Claims, 5 Drawing Sheets

MULTI-BIT SIGMA-DELTA MODULATOR AND DIGITAL-TO-ANALOG CONVERTER WITH ONE DIGITAL-TO-ANALOG CAPACITOR

CROSS-REFERENCE TO RELATED APPLICATION

This application claims priority to and the benefit of Korean Patent Application No. 2005-118141, filed Dec. 6, 2005, and 2006-50320 filed Jun. 5, 2006, the disclosure of which is incorporated herein by reference in its entirety.

BACKGROUND

1. Field of the Invention

The present invention relates to a sigma-delta modulator, and more particularly, to a multi-bit sigma-delta modulator and a digital-to-analog converter for a sigma-delta modulator that are capable of implementing a five-level output through one capacitor in single ended form. The digital-to-analog converter of the present invention may be extendible to a differential operation. Hereinafter, a configuration based single ended form will be described for convenience.

2. Discussion of Related Art

Generally, a sigma-delta modulator includes two blocks: an integrator for integrating a difference between an input analog signal and an output signal of a digital-to-analog converter (DAC) according to a code of an analog-to-digital converter (ADC), and the ADC for converting an analog output of the integrator into a digital signal.

FIG. 1A is a block diagram illustrating a general first-order sigma-delta modulator, and FIG. 1B illustrates the first-order sigma-delta modulator of FIG. 1A as a linear model.

As illustrated in FIGS. 1A and 1B, the general first-order sigma-delta modulator is configured with a negative feedback, and the ADC in the first-order sigma-delta modulator may be replaced with a model in which quantization noise is added. An output (Vout) that is the result of interpreting the general first-order sigma-delta modulator using the linear model of FIG. 1B is given by Formula 1.

[Formula 1]

$$V\text{out} = \frac{1}{s+1}V\text{in} + \frac{s}{s+1}e$$

As shown in Formula 1, the output (Vout) indicates a low-pass characteristic with respect to an input (Vin), and indicates a high-pass characteristic with respect to the quantization noise (e). Therefore, if a low pass filter is used to produce an output of the sigma-delta modulator, the output may have low quantization noise and, accordingly, a high signal-to-noise ratio (SNR).

The SNR of the sigma-delta modulator having the above-described characteristics is determined by the number of integrators (L), which may be indicated as an order of the modulator, the number of ADC bits, and an oversampling ratio, which is a ratio of sampling frequency range to signal frequency range. The maximum SNR is given by Formula 2.

[Formula 2]

$$SNR(\text{dB}) = $$
$$1.76 + 20\log(2^B - 1) + 10\log M + 20 \cdot L \cdot \log M + 20\log\frac{\sqrt{2L+1}}{\pi^L}$$

As shown in Formula 2, to increase the SNR, the order, the number of ADC bits, or the oversampling ratio should be increased.

However, the method of increasing the order has a problem regarding stability, and reduces an available signal range. Also, since the method of increasing the oversampling ratio requires a high sampling frequency, a circuit should operate at high speed. Therefore, the above-mentioned methods are not suitable for the low-voltage, high-speed sigma-delta modulator.

Meanwhile, the number of ADC bits in the high-resolution, high-speed, and low voltage sigma-delta modulator may be increased. However, when the number of ADC bits is increased, the performance of the sigma-delta modulator may be affected by linear characteristics of the DAC in a negative feedback loop.

FIG. 2 illustrates an integrator in the form of a commonly used switched capacitor also performing a function of a B-bit DAC. In FIG. 2, mismatching of a DAC capacitor 10 directly affects DAC linear characteristics. Since the mismatching of capacitors 11 through 12 is determined by a process characteristic, there is a limit to improving the mismatching characteristic. Accordingly, the performance of the high-resolution, high-speed, and low voltage sigma-delta modulator may deteriorate due to the capacitor mismatching.

Therefore, to solve a problem regarding the DAC capacitor mismatching, various methods such as Random Averaging, Clocked Averaging (CLA), Individual Level Averaging (ILA), Data Weighted Averaging (DWA), etc., have been suggested. However, these methods require a lot of complex digital circuits, and under certain conditions the performance of the DAC may deteriorate.

SUMMARY OF THE INVENTION

The present invention is directed to a circuit for implementing a digital-to-analog converter (DAC) in which operation of a multi-bit DAC may be efficiently implemented using one in single ended form, and DAC capacitor mismatching does not occur.

The present invention is also directed to a multi-bit sigma-delta modulator using a DAC.

One aspect of the present invention provides a DAC including: a digital-to-analog converter (DAC) capacitor with a switched capacitor structure using two phases; and switches for connecting reference voltages with different polarities across the DAC capacitor when the two phases are converted.

Another aspect of the present invention provides a multi-bit sigma-delta modulator including: an integrator for integrating a difference between an output signal and an input analog signal of a digital-to-analog converter having a DAC capacitor with a switched capacitor structure using two phases, and switches for connecting reference voltages with different polarities across the DAC capacitor when the two phases are converted; and an analog-to-digital converter for converting the analog output of the integrator into a digital signal and outputting the converted digital signal.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various modified forms. The following exemplary embodiments are described solely for the purpose of providing a clear and enabling disclosure of the present invention. While the following detailed description focuses on single ended form, the invention is extendible to a commonly used differential structure.

Figure 1A:
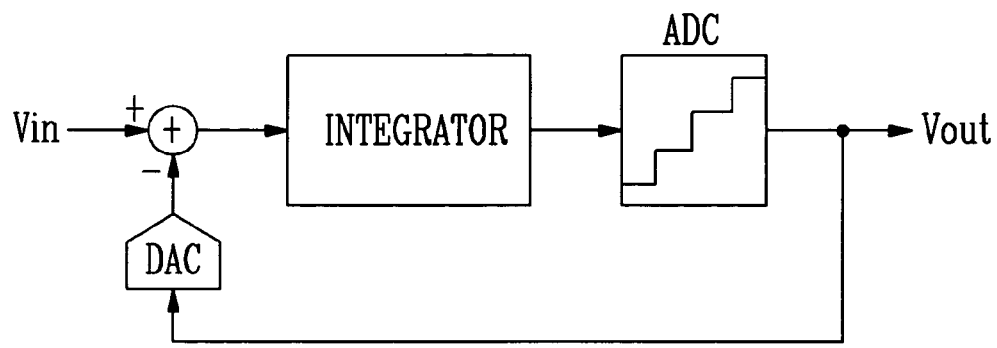
FIG. 1A is a block diagram schematically illustrating a general sigma-delta modulator.
Figure 1B:
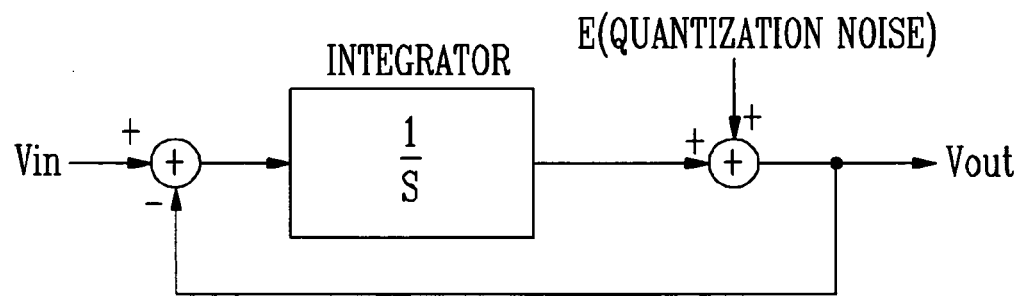
FIG. 1B illustrates a linear model of the sigma-delta modulator of FIG. 1A.
Figure 2:
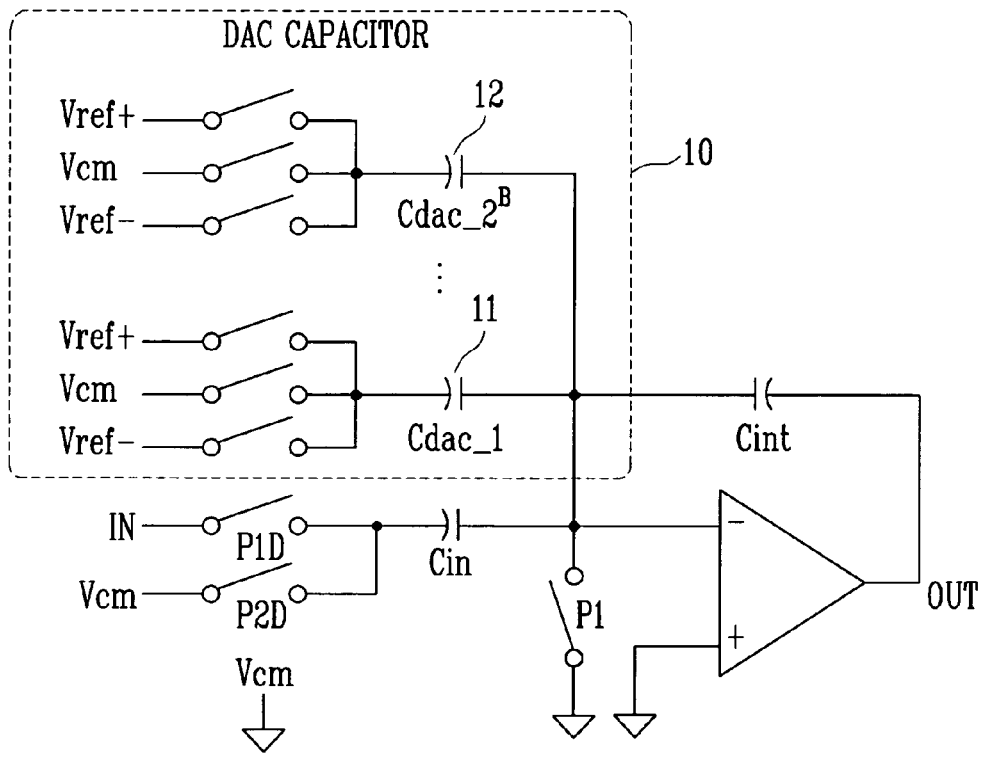
FIG. 2 is a circuit diagram illustrating an integrator including a function of a conventional multi-bit digital-to-analog converter (DAC)
Figure 3:
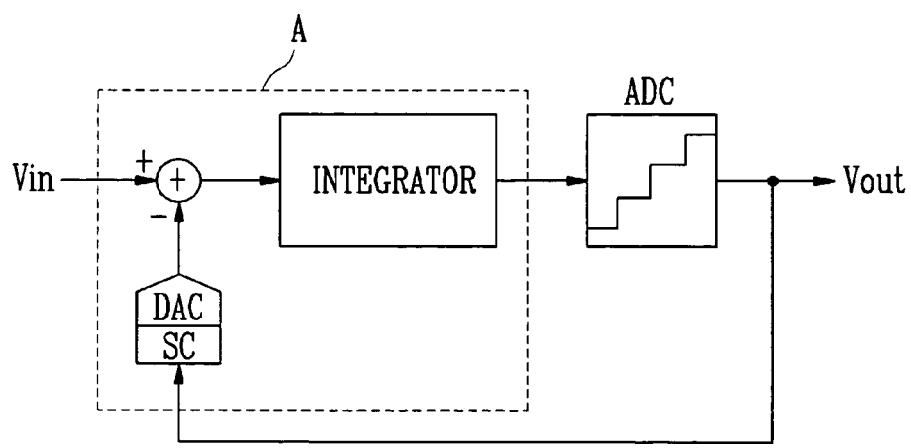
FIG. 3 is a block diagram of a first-order sigma-delta modulator according to an exemplary embodiment of the present invention.
Figure 4A:
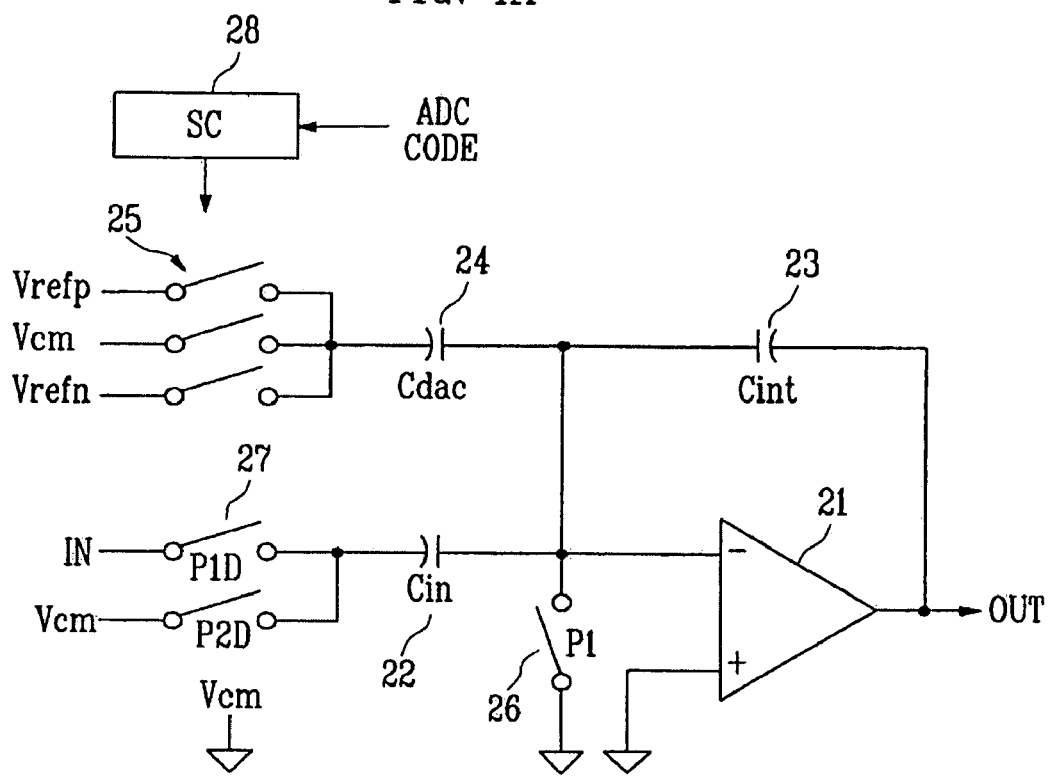
FIG. 4A a circuit diagram illustrating a DAC sharing an operational amplifier with an integrator in a first-order sigma-delta modulator according to an exemplary embodiment of the present invention.
Figure 4B:
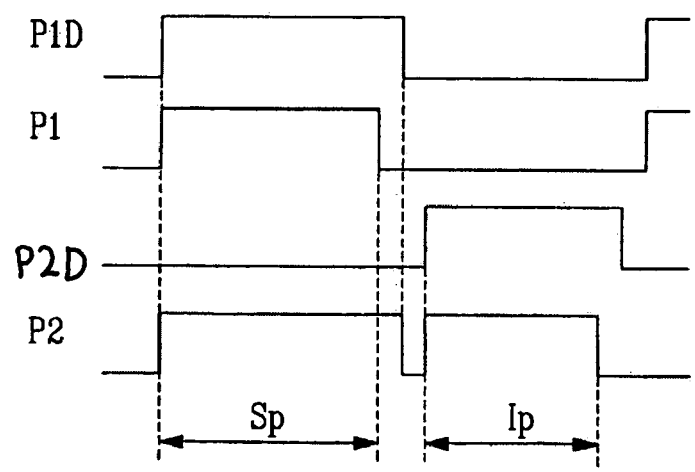
FIG. 4B is a clock timing diagram illustrating operation of the first-order sigma-delta modulator of FIG. 4A.

FIG. 3 is a block diagram illustrating a first-order sigma-delta modulator according to an exemplary embodiment of the present invention. FIG. 4A is a circuit diagram illustrating a digital-to-analog converter (DAC) sharing an operational amplifier with an integrator inside the first-order sigma-delta modulator. This drawing is for explaining the integrator of the sigma-delta modulator, and the digital-to-analog converter applied to the integrator. FIG. 4B is a clock timing diagram illustrating operation of the sigma-delta modulator of FIG. 4A.

The DAC according to the present invention shares the operational amplifier with the integrator of the general sigma-delta modulator. In other words, this configuration may be illustrated as the first-order system shown in the block diagram of FIG. 3. A of FIG. 3 performs a function of the DAC in addition to the function of integrating an input signal (Vin). FIG. 4A is a circuit diagram illustrating the first-order system of FIG. 3 in more detail.

As shown in FIG. 4A, the sigma-delta modulator according to an exemplary embodiment of the present invention includes an operational amplifier 21, a sampling capacitor (Cin) 22, an integration capacitor (Cint) 23, a DAC capacitor (Cdac) 24, switches 25 to 27, and a switching controller (SC) 28.

The sampling capacitor 22 is connected between a first switch 26 and an input terminal of the operational amplifier 21, and the first switch 26 is connected between the input terminal of the operational amplifier 21 and a ground, and the second switch 27 is connected between an input (IN) and the sampling capacitor 22.

The integration capacitor 23 connects an output (OUT) to the input terminal of the operational amplifier 21 to constitute a negative feedback loop. The DAC capacitor 24 is connected between a switch for the DAC 25 and the input terminal of the operational amplifier 21.

The switch for the DAC 25 connects reference voltages (Vrefp, Vcm, and Vrefn) to the DAC capacitor 24 so that the DAC with a switched capacitor structure can perform required operations. The switching controller 28 generates a control signal in response to an analog-to-digital converter (ADC) output code of the modulator, and controls operation of the switch for the DAC 25 using the generated control signal.

Operation of the sigma-delta modulator according to an exemplary embodiment of the present invention will be described below.

The switch 27 of FIG. 4A is turned on when a clock signal P1D is at a high-level or "1", and the switch 26 is turned on when a clock signal P1 is at the high-level or "1". The switch 25 is controlled by a logic circuit using clock signals of P1D, and P2D, and ADC codes. As illustrated in FIG. 4B, the input analog signal (IN) is sampled by the sampling capacitor 22 during a sampling phase (Sp), is summed with a previous output of the integrator, which is charged in the integration capacitor 23 during the integration phase (Ip), and then the summed result is integrated.

Operation of the DAC according to the present invention may be implemented in two phases, which is different from the conventional method using one phase. After the reference voltages according to the ADC code are sampled during the sampling phase and connected to the reference voltages according to the ADC code during the integration phase, the DAC operation is performed. The reference voltages connected to the DAC capacitor 24 according to the ADC code, and the amount of charge transferred to the integration capacitor, are listed in Table 1.

TABLE 1

| ADC CODE | P1 | P2 | Amount of Transferred Charge |
|---|---|---|---|
| 4 | Vrefn | Vrefp | Cdac * (Vrefn-Vrefp) = −2 * Cdac * Vref+ |
| 3 | Vcm | Vrefp | Cdac * (Vcm-Vrefp) = −1 * Cdac * Vref+ |
| 2 | Vcm | Vcm | Cdac * (Vcm-Vcm) = 0 |
| 1 | Vcm | Vrefn | Cdac * (Vcm-Vrefn) = +1 * Cdac * Vref+ |
| 0 | Vrefp | Vrefn | Cdac * (Vrefp-Vrefn) = +2* Cdac * Vref+ |

Meanwhile, if the following Formula 3 is applied to the sigma-delta modulator according to an exemplary embodiment of the present invention, the output (OUT) is given by Formula 4.

$$(Vrefp-Vrefn) = -(Vrefn-Vrefp) = 2(Vcm-Vrefn) = -2(Vcm-Vrefp) \quad \text{[Formula 3]}$$

[Formula 4]

$$Vout(n) = Vout(n-1) + \frac{Cin}{Cint} \cdot Vin(n) + \frac{Cdac}{Cint} \cdot D \cdot Vref + D = \begin{cases} +2 & (ADC\ CODE = 4) \\ +1 & (ADC\ CODE = 3) \\ 0 & (ADC\ CODE = 2) \\ -1 & (ADC\ CODE = 1) \\ -2 & (ADC\ CODE = 0) \end{cases}$$

As shown in Formula 4, the term (Cdac/Cint)*D*Vrefp performs the same function as the DAC having five levels according to a value of D. For example, the switch serves to convert the reference voltage applied to the DAC capacitor from a negative reference voltage to "0", from a positive reference voltage to "0", from "0" to "0", from the negative reference voltage to the positive reference voltage, and from the positive reference voltage to the negative reference voltage when the two phases are converted. Thus, the DAC having five levels may be implemented using one DAC capacitor 24. As described above, the performance of the sigma-delta modulator does not deteriorate due to DAC capacitor mismatching, and its circuit can have a simple configuration.

Meanwhile, as shown in FIG. 4A, if the sigma-delta modulator has the single ended form, the condition of Formula 3 is not satisfied, and thus, DAC non-linearity may occur. However, if the circuit is fully differential, the charge listed in the following Table 2 is transferred to the integration capacitor 23 and appears in the form of an integral multiple of the difference between two reference voltages with different polarities (Vrefp−Vrefn). Therefore, the mismatching characteristic caused by the reference voltages disappears.

TABLE 2

| ADC CODE | Amount of Differentially Transferred Charge |
|---|---|
| 4 | 2 * Cdac * (Vrefn-Vrefp) = −2 * Cdac * (Vrefp-Vrefn) |
| 3 | Cdac * (Vrefn-Vrefp) = −1 * Cdac * (Vrefp-Vrefn) |
| 2 | Cdac * (Vcm-Vcm) = 0 |
| 1 | Cdac * (Vrefp-Vrefn) = +1 * Cdac * (Vrefp-Vrefn) |
| 0 | 2 * Cdac * (Vrefp-Vrefn) = +2 * Cdac * (Vrefp-Vrefn) |

Figure 5:
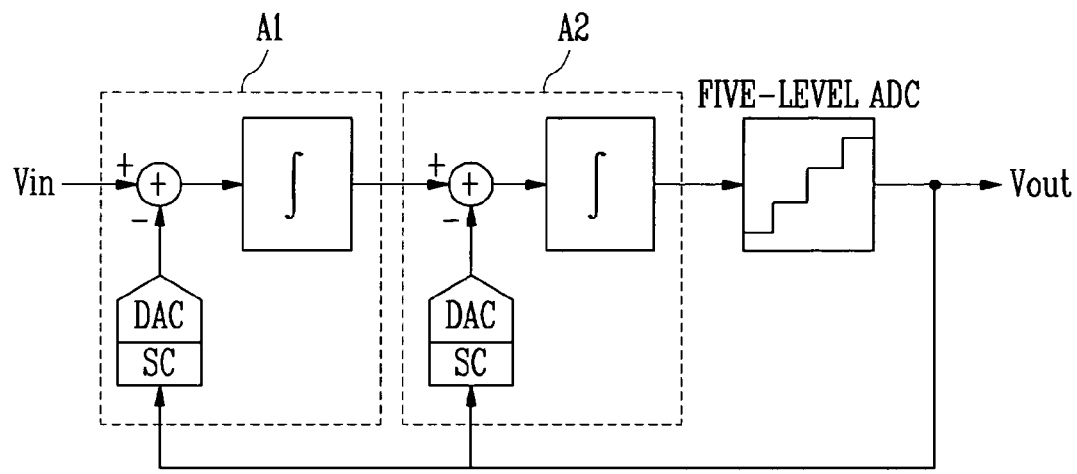
FIG. 5 is a block diagram illustrating a second-order sigma-delta modulator including a five-level analog-to-digital converter (ADC)/DAC.
Figure 6A:
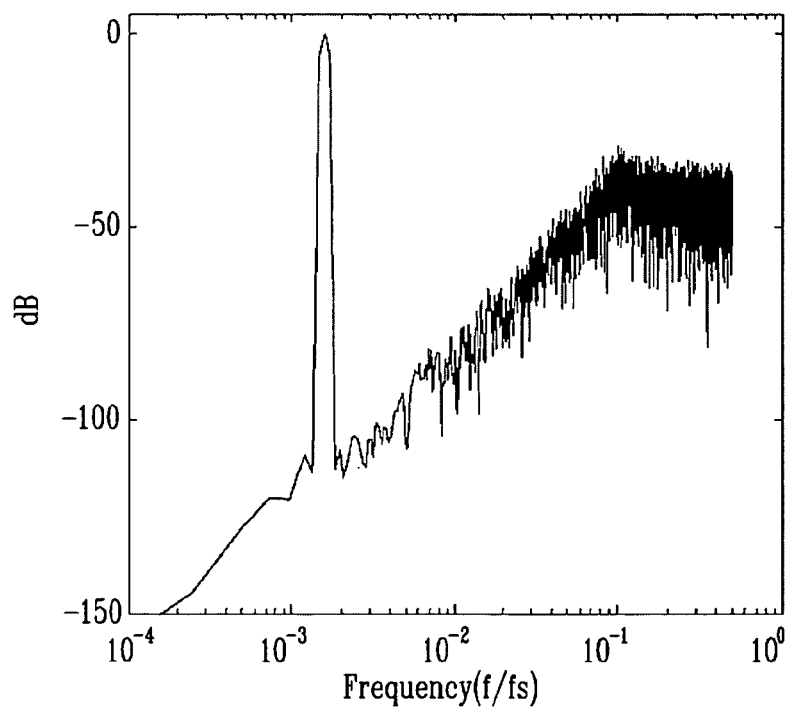
FIG. 6A is a graph illustrating simulation results of an ideal five-level second-order sigma-delta modulator.
Figure 6B:
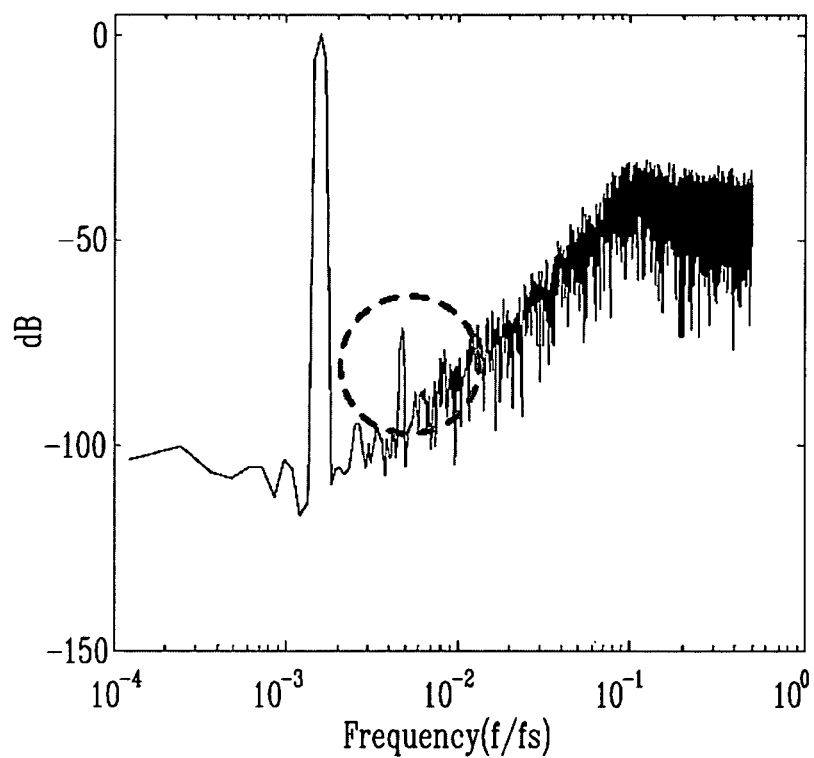
FIG. 6B is a graph illustrating results of an Hspice simulation of a five-level second-order sigma-delta modulator employing a DAC having 0.2% capacitor mismatching and an ideal integrator.
Figure 6C:
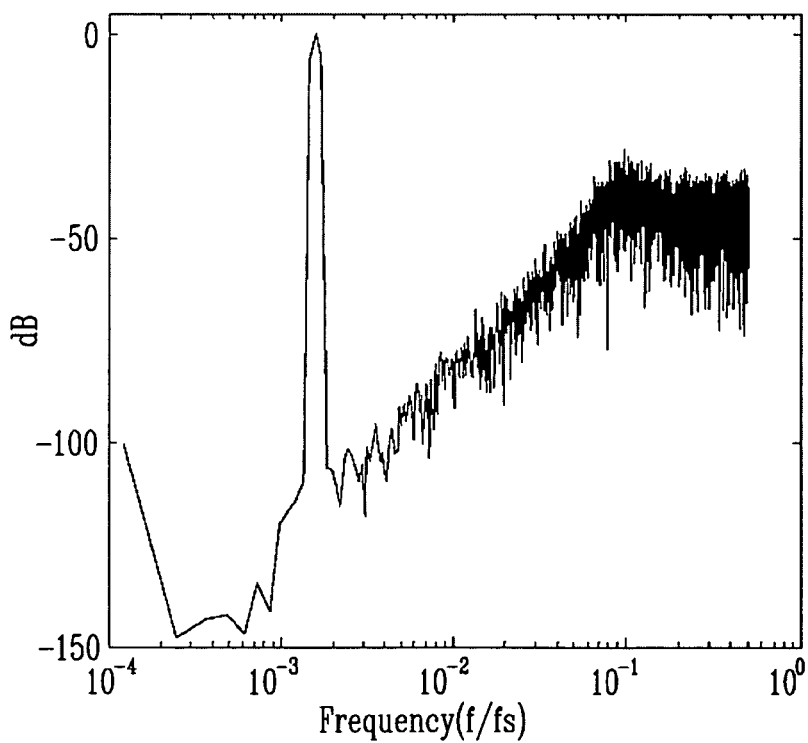
FIG. 6C is a graph illustrating results of an Hspice simulation of a five-level second-order sigma-delta modulator employing a DAC having 0.2% capacitor mismatching according to an exemplary embodiment of the present invention.

FIG. 5 is a block diagram illustrating a second-order sigma-delta modulator including a five-level analog-to-digital converter (ADC)/DAC. FIG. 6A is a graph illustrating simulation results of an ideal five-level second-order sigma-delta modulator. FIG. 6B is a graph illustrating results of an Hspice simulation of a five-level second-order sigma-delta modulator employing a DAC having 0.2% capacitor mismatching and an ideal integrator. FIG. 6C is a graph illustrating results of an Hspice simulation of a five-level second-order sigma-delta modulator employing a DAC having 0.2% capacitor mismatching according to an exemplary embodiment of the present invention.

When there is DAC capacitor mismatching, an unwanted tone is generated from a frequency response of the sigma-delta modulator illustrated as a dotted-line circle in FIG. 6B. However, in the simulation results according to the present invention, no tone is generated, which is almost the same result as obtained for the ideal sigma-delta modulator of FIG. 6A. This result displays the technical excellence of the present invention.

Meanwhile, when the above-described DAC of the sigma-delta modulator is configured to perform a differential operation, the switch of the DAC may perform its switching operation corresponding to "0". The switching operation corresponding to "0" refers to a switching operation in which an input is connected to an output having the same potential as the input, among two inputs and two outputs.

As described above, with respect to the DAC used for the integrator of the multi-bit sigma-delta modulator, the present invention enables five-level DAC operation using one capacitor in a single ended form, thereby removing non-linearity caused by capacitor mismatching. While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A five-level digital-to-analog converter of a sigma-delta modulator, comprising:
   a digital-to-analog converter (DAC) capacitor having a switched capacitor structure using two phases; and
   three switches for connecting reference voltages with different polarities to a common terminal of the DAC capacitor when the two phases are converted, the three switches consisting of:
   a first switch for connecting a positive reference voltage to the common terminal of the DAC capacitor;
   a second switch for connecting a "0" reference voltage to the common terminal of the DAC capacitor; and
   a third switch for connecting a negative reference voltage to the common terminal of the DAC capacitor;
   wherein the reference voltages with different polarities connected to the common terminal of the DAC capacitor are combined according to the two phases to provide five-level output.

2. The five-level digital-to-analog converter according to claim 1, wherein the switch serves to convert the reference voltage applied to the DAC capacitor from a negative reference voltage to "0", from a positive reference voltage to "0", from "0" to "0", from the negative reference voltage to the positive reference voltage, and from the positive reference voltage to the negative reference voltage.

3. The five-level digital-to-analog converter according to claim 2, wherein the conversion from "0" to "0" includes a switching operation corresponding to "0".

4. The five-level digital-to-analog converter according to claim 3, wherein the switching method of the switch is used to implement a DAC with five levels using only one DAC capacitor in single ended form.

5. The five-level digital-to-analog converter according to claim 2, wherein the switching method of the switch is used to implement a DAC with five levels using only one DAC capacitor in single ended form.

* * * * *